US005530706A

United States Patent [19]
Josephson et al.

[11] Patent Number: 5,530,706
[45] Date of Patent: Jun. 25, 1996

[54] NON-DESTRUCTIVE SAMPLING OF INTERNAL STATES WHILE OPERATING AT NORMAL FREQUENCY

[75] Inventors: Don D. Josephson; Barry J. Arnold, both of Fort Collins, Colo.

[73] Assignee: Hewlett-Packard Company, Palo Alto, Calif.

[21] Appl. No.: 539,382

[22] Filed: Oct. 5, 1995

Related U.S. Application Data

[63] Continuation of Ser. No. 137,442, Oct. 15, 1993, abandoned.

[51] Int. Cl.$^6$ .............................. G06F 15/20; H04B 17/00
[52] U.S. Cl. .................. 371/22.3; 371/22.1; 371/22.2; 371/22.4; 371/22.5; 371/22.6; 307/407
[58] Field of Search .................................. 371/22.1–22.6; 364/488; 307/407, 36

[56] References Cited

U.S. PATENT DOCUMENTS

| | | | |
|---|---|---|---|
| 4,597,042 | 6/1986 | d'Angeac et al. | 371/22.3 OR |
| 5,231,314 | 7/1993 | Andrews | 321/22.1 |
| 5,299,136 | 3/1994 | Babakanian et al. | 371/22.5 |
| 5,313,470 | 5/1994 | Simpson | 371/22.1 |

OTHER PUBLICATIONS

Pereira et al., "Pipelined TSPC barrel shifter with scan test facilities for VLSI implementation of high speed DSP applications"; IEEE, 1992; Periodical: EURO ASIC pp. 405–466.
Josephson et al., "Test Features of HP PA7100LC processor"; IEEE conference paper; 17–21 Oct., 1993 pp. 764–772.

*Primary Examiner*—Emanuel T. Voeltz
*Assistant Examiner*—Kamini Shah
*Attorney, Agent, or Firm*—Augustus W. Winfield; Patrick J. Murphy

[57] ABSTRACT

A test system for a digital integrated circuit in which internal states of the integrated circuit are captured non-destructively while the digital circuit is operating at normal clock speed. Cells for capturing states are sequentially connected into shift registers. Once internal states are latched within cells, the captured states are serially shifted out a test port while the integrated circuit continues to operate. State sampling is triggered internally via a software command or externally via an external signal synchronized to an internal clock.

4 Claims, 7 Drawing Sheets

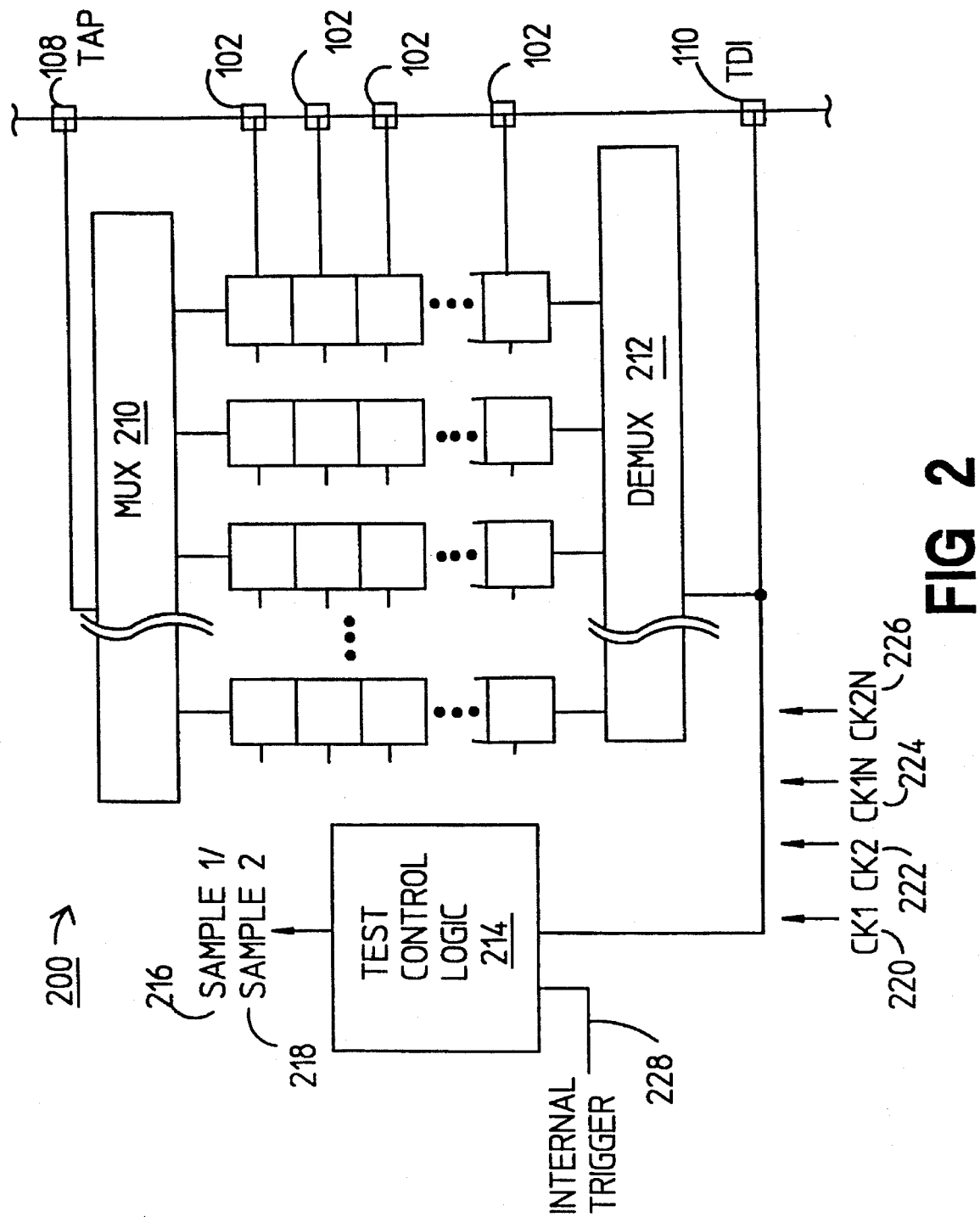

ary signals are captured. Internal component states are generally not captured unless the component is in a special test mode in which internal states are propagated to the boundary just for testing. There is a need for testing that captures internal logic states at the operating frequency of the device. There is a need for capturing internal logic states at the operating frequency of the device and reading those captured internal states using industry standard boundary scan testing ports. There is a need for a test system that non-destructively captures internal logic states while the device is operating at normal frequency and that permits reading of the captured states while the device continues to operate.

NON-DESTRUCTIVE SAMPLING OF INTERNAL STATES WHILE OPERATING AT NORMAL FREQUENCY

CROSS REFERENCE TO RELATED APPLICATION

This is a continuation of application Ser. No. 08/137,442 filed on Oct. 15, 1993, now abandoned.

FIELD OF INVENTION

This invention relates generally to electronic testing of digital integrated circuits and to design-for-testing of digital integrated circuits.

BACKGROUND OF THE INVENTION

A significant cost in electronics manufacturing is testing. Individual components must be tested and assembled systems must be tested. It is common to include additional circuitry to facilitate testing. Circuitry for testing is typically used in a special test mode, often under static conditions. That is, the test circuitry is used to sequence an integrated circuit through states specifically for testing and the results are monitored with the system clock slowed or paused. It is also common to include circuitry to capture the state of input/output signals (called boundary scan testing). A commonly used standard for such circuitry is IEEE Std. 1149.1-1990, *IEEE Standard Test Access Port and Boundary-Scan Architecture,* available from The Institute of Electrical and Electronic Engineers, Inc., 345 East 47th Street, New York, N.Y. 10017-2394. IEEE Std. 1149.1 defines a standard serial interface through which test instructions and test data are communicated. The technique involves the inclusion of a shift-register stage adjacent to each component pin of interest so that signals at component boundaries can be controlled and observed. The special shift-registers and test instructions can be used in isolated component testing and in testing individual components assembled into larger systems.

The IEEE 1149.1 standard defines a Test Access Port (TAP). The standard also includes specification of a test clock (TCK). Typically, testing compatible with the IEEE 1149.1 standard requires synchronization of the test clock TCK and internal component clocks. Generally, only bound-

SUMMARY OF THE INVENTION

The present invention incorporates scan registers within internal circuitry. The scan registers capture the internal state of integrated circuits in addition to boundary scan data. The sampling of internal states is non-destructive. Careful design of test circuitry clocking enables internal logic states to be captured while the integrated circuits are operating at normal operating frequency. The system clock and the scan test clock are independent, enabling access to the internal states through a standard Test Access Port while the integrated circuit continues to operate. Private test instructions introduced through the standard Test Access Port enable internal state capture to be triggered internally by processor instructions within system software or externally by an external signal synchronized to internal clocks.

BRIEF DESCRIPTION OF THE DRAWINGS

FIG. 2 is a block diagram of an integrated circuit with shift register cells used for capturing internal states in addition to boundary states.

DETAILED DESCRIPTION OF THE PREFERRED EMBODIMENT OF THE INVENTION

Figure 1A:
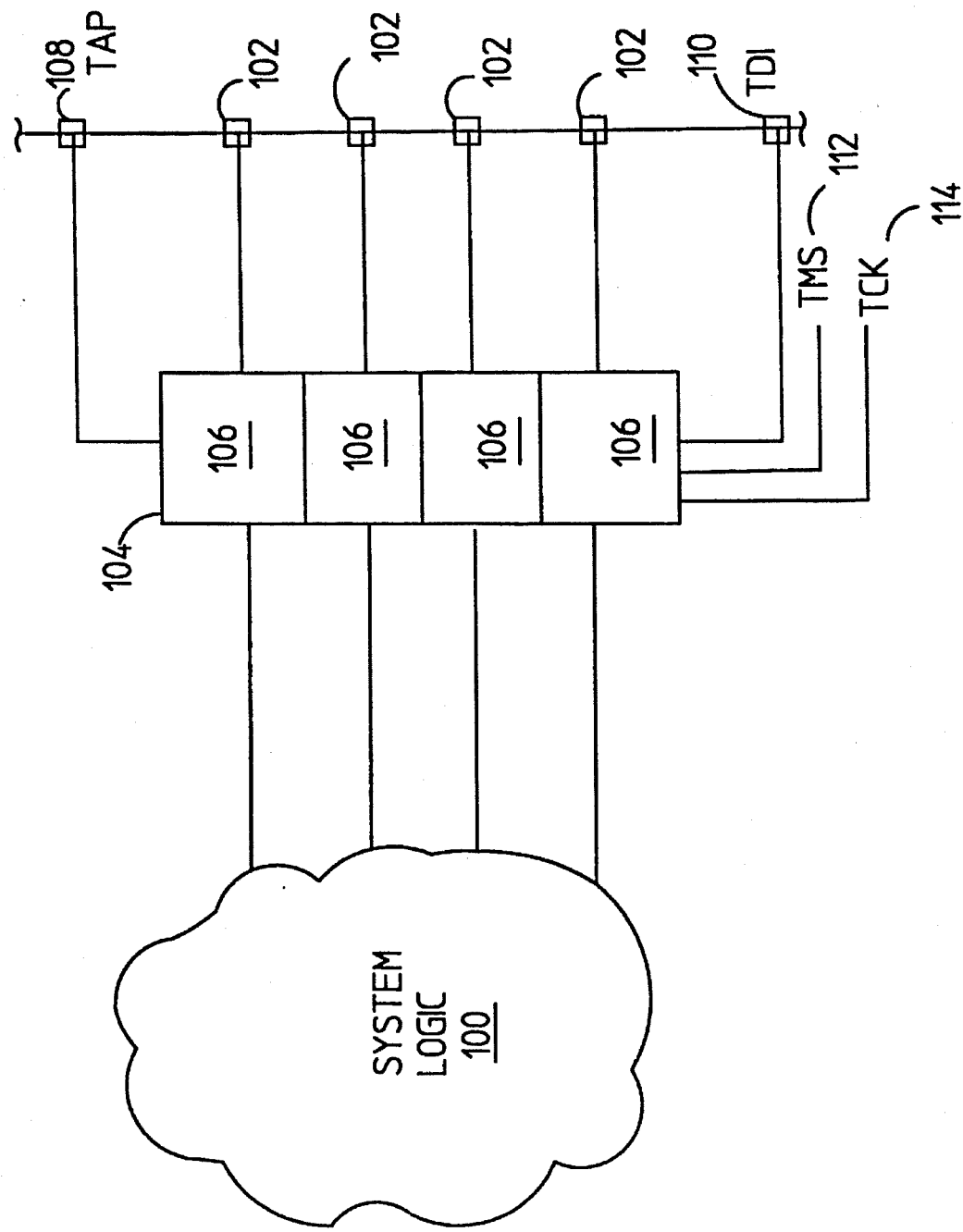
FIG. 1A is a block diagram of a logic circuit with a boundary scan Test Access Port.

FIG. 1A illustrates an integrated circuit with internal system logic 100 connected to input/output (I/O) pins 102. A boundary scan shift register 104 is comprised of a series of boundary scan cells 106. Each boundary scan cell 106 can capture the state of an output from logic 100 or an input to logic 100 and shift the captured state serially out a Test Access Port (TAP) 108. Alternatively, input test data 110 can be shifted into the boundary scan shift register 104 and used to drive the I/O pins 102 (if I/O pins 102 are outputs) or to drive the system logic 100 (if I/O pins 102 inputs) with special test vectors. A mode input 112 determines whether the boundary scan shift register 104 is being used to capture signals, drive signals, or shift data in or out. A Test Clock Signal (TCK) 114 provides a shift clock and other timing.

Figure 1B:
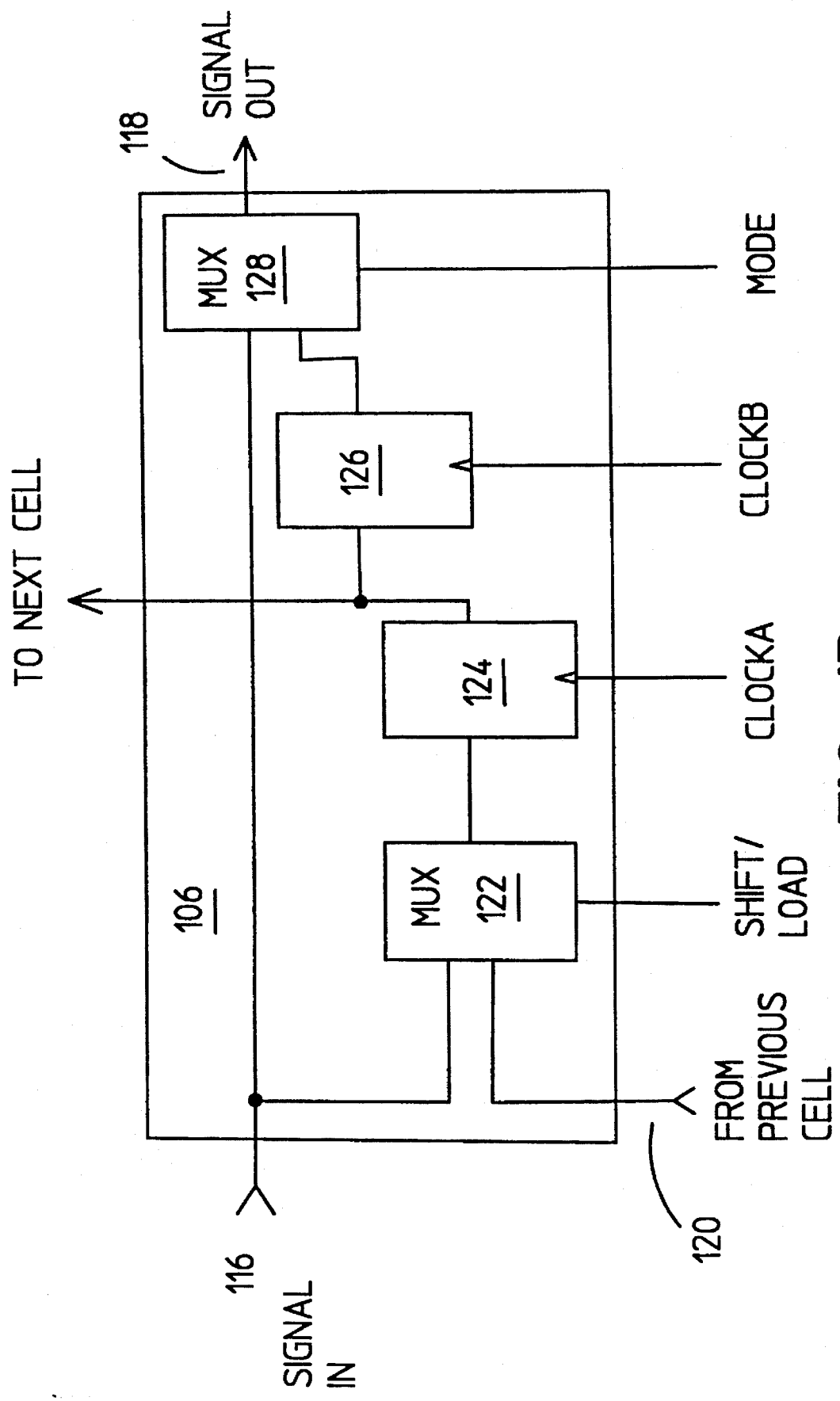
FIG. 1B is a schematic of a representative shift register cell used in the boundary scan apparatus of FIG. 1A.

FIG. 1B illustrates a sample boundary scan cell 106. The cell 106 illustrated in FIG. 1B can be used for input pins, in which the input signal 116 is connected to an I/O pin 102, or for output pins, in which the output signal 118 is connected to an I/O pin 102. Multiplexer circuit 122 determines whether input data 116 or previous scan cell data 120 is latched by latch 124. Latch 126 latches data for driving the output signal 118 with test data. Multiplexer circuit 128 determines whether input data 116 or latched test data 126 drives the output 118.

FIG. 2 illustrates an integrated circuit 200 with multiple test-data shift registers 202–208. One shift register (202) is connected to I/O pins 102 and serves as a boundary scan shift register. The remaining shift registers 204–208 capture internal logic states. The serial output of any one shift register (202–208) may be selected by multiplexer circuit 210 for shifting out through a single Test Access Port (TAP) 108. Similarly, test data input (TDI) 110 can be switched by demultiplexer circuit 212 to any of the shift registers 202–208. For simplicity, only four shift registers 202–208 are illustrated in FIG. 2. In a specific implementation for a very large scale integrated microprocessor circuit, for example, there are 19 separate shift registers capturing a total of approximately 5000 states including approximately 300 I/O states.

Figure 3:
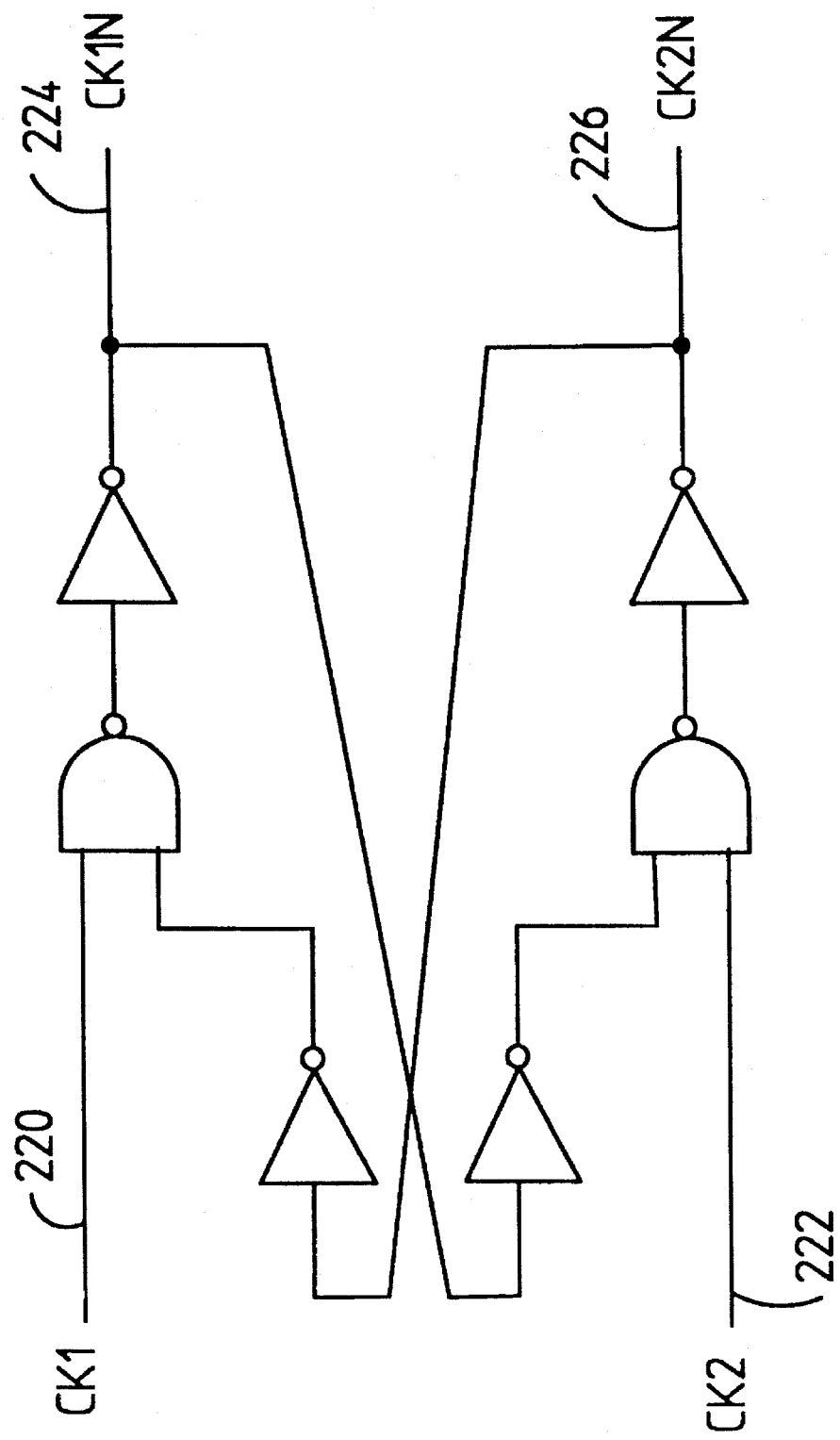
FIG. 3 is a schematic of a clock generation circuit for generating two non-overlapping clock signals.

Also illustrated in FIG. 2 are four clock signals CK1 (220), CK2 (222), CK1N (224) and CK2N (226). These clock signals are distributed throughout the logic circuitry within the integrated circuit 200 and to each cell within the test-data shift registers (204–208). CK1 (220) is a symmetrical master clock. CK2 (222) is CK1 (220) inverted. Because of unavoidable jitter and skew, it is possible for CK1 (224), and CK2 (222) to overlap. That is, there may be very small time intervals during which CK1 (220) and CK2 (222) are both high. For some queues of transparent latch stages with alternating clocks, overlapping clocks can create undesirable race conditions. These race conditions can be eliminated by the use of non-overlapping clocks. FIG. 3 illustrates a circuit for deriving two non-overlapping clocks (CK1N 224 and CK2N 226) in which both clocks can never be high simultaneously. In FIG. 3, note that CK1N (224) cannot go high until CK2N (226) is low and CK2N (226) cannot go high until CK1N (224) is low.

Refer again to FIG. 2. IEEE Std. 1149.1 includes provisions for input of standard test instructions. Instructions are serially shifted in through the Test Data Input (FIG. 2, 110) and executed by test circuitry (FIG. 2, 214). IEEE Std. 1149.1 also permits private instructions. In conjunction with the present invention, two private instructions are implemented that enable two unique signals to be generated with critical timing: SAMPLE1 (216) and SAMPLE2 (218). SAMPLE1 (216) and SAMPLE2 (218) can be triggered either internally (INTERNAL TRIGGER 228) within the integrated circuit 200 or externally through the Test Data Input (TDI) 110. A private instruction called ISAMPLE is used in conjunction with internal triggering of the SAMPLE1 (216) and SAMPLE2 (218) signals and a private instruction called ESAMPLE is used in conjunction with external triggering of the SAMPLE1 (216) and SAMPLE2 (218) signals.

For internal triggering of the SAMPLE1 signal (216), many internal signals synchronized to internal clocks can be used. For example, signals generated as a result of error conditions, processor interrupts, or signals generated as a result of software commands. In one example embodiment, an internal interrupt signal is used. In the example embodiment, the integrated circuit 200 includes an interval timer (not illustrated) that generates an interrupt when the interval timer reaches a count that matches a preset value in a register. The interval timer increments by one for each system clock cycle. By setting the register preset value in software, an interrupt can be generated immediately or after a desired number of clock cycles. The resulting interrupt signal is routed to the INTERNAL TRIGGER signal 228 on the test control logic 214. If the test control logic contains an ISAMPLE instruction and if the test control logic is in a Run-Test/Idle State (see IEEE Std. 1149.1, chapter 5), then the test control logic generates a SAMPLE1 signal (216) on the rising edge of CK1 (220) (see FIG. 5).

For external triggering, the ESAMPLE instruction is scanned into the Test Data Input (TDI) 110 and the Run-Test/Idle state is entered. Once the RunTest/Idle state is entered, the next rising edge which occurs on the Test Data Input pin (TDI) (110) generates a SAMPLE1 signal (216) as described above. The test clock TCK (FIG. 1A, 114) is completely independent from the four system clocks (220, 222, 224, 226). Therefore, external triggering requires additional external circuitry such as a logic analyzer or special debugging circuitry to use the rising edge of CK1 (220) to gate a signal at the Test Data Input (TDI) pin (110).

Figure 4A:
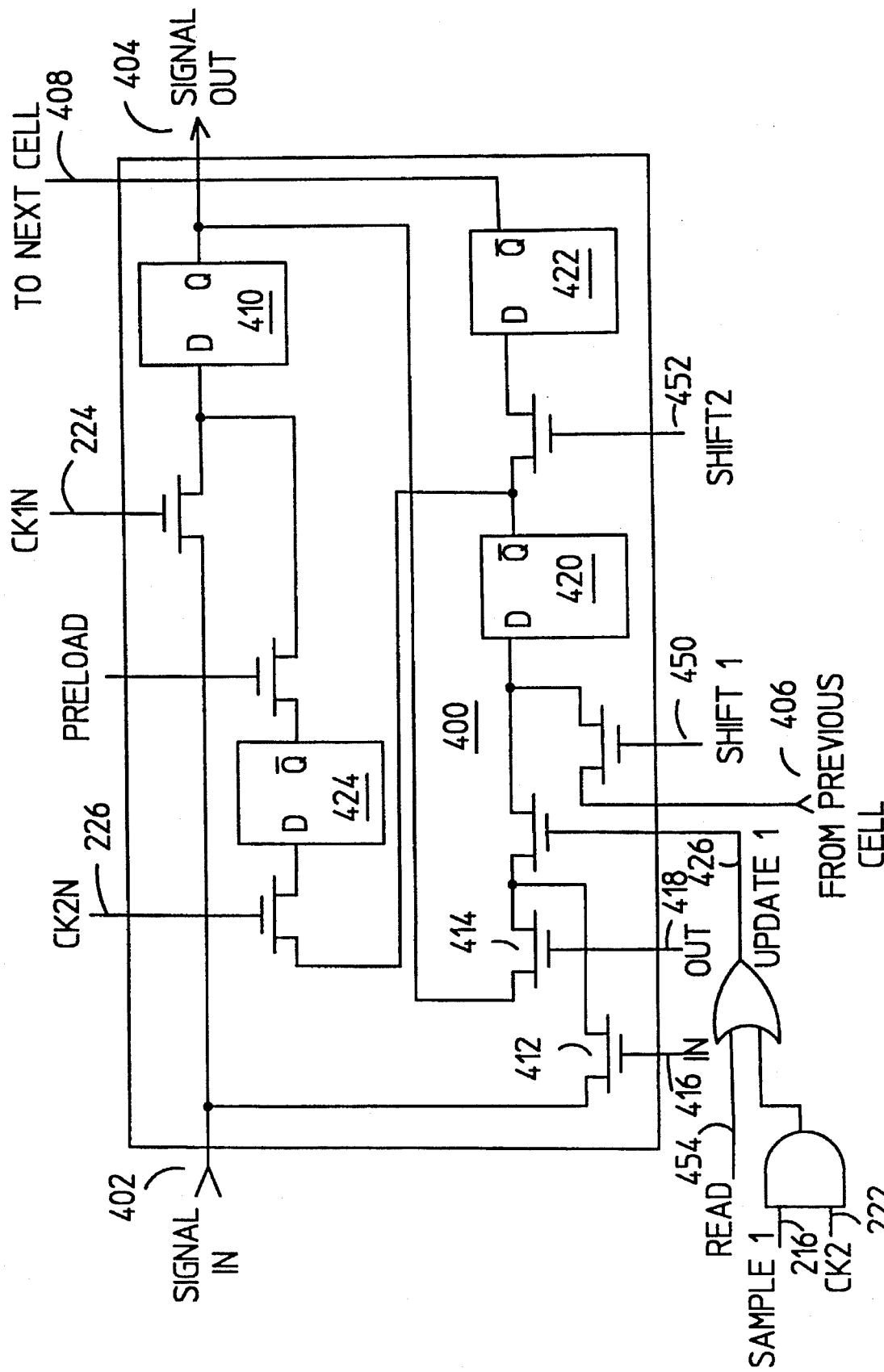
FIG. 4A is a schematic of a representative shift register cell used in the shift registers of FIG. 2.

FIG. 4A illustrates a scan cell 400 for use in capturing internal states by shift registers 204–208 in FIG. 2. There is an input signal 402, an output signal 404, a test scan input 406 from a previous shift register cell and a test scan output 408 to the next shift register cell. In contrast to the scan cell in FIG. 1B which captures the state of a single node, the scan cell 400 illustrated in FIG. 4 checks both the input and the output of a latch 410. Transistors 412 and 414 along with control signals IN (416) and OUT (418) serve as a multiplexer that selects whether the input state 402 or the output state 404 is captured. In general, the scan cell 400 is used to capture an input and an output of more complex logic and latching stages instead of just a single latch 410 as illustrated. The single latch 410 is used to simplify the discussion. All latches illustrated in FIG. 4A are transparent. That is, the Q output tracks the D input if the D input changes. When the D input is open (input FET is off), the latch retains its previous state.

In FIG. 4A, latch 420 captures the state of the cell input 402, the cell output 404 or incoming serial data 406. During serial shifting of data, latches 420 and 422 serve as a master-slave flip-flop permitting incoming serial data 406 to be latched by transparent latch 420 while serial output data 408 is being shifted out from transparent latch 422. Latch 424 is used to drive the latch 410 with test data. Latch 424 and its associated input and output transistors are optional and are deleted where control is not possible or necessary.

Figure 4B:
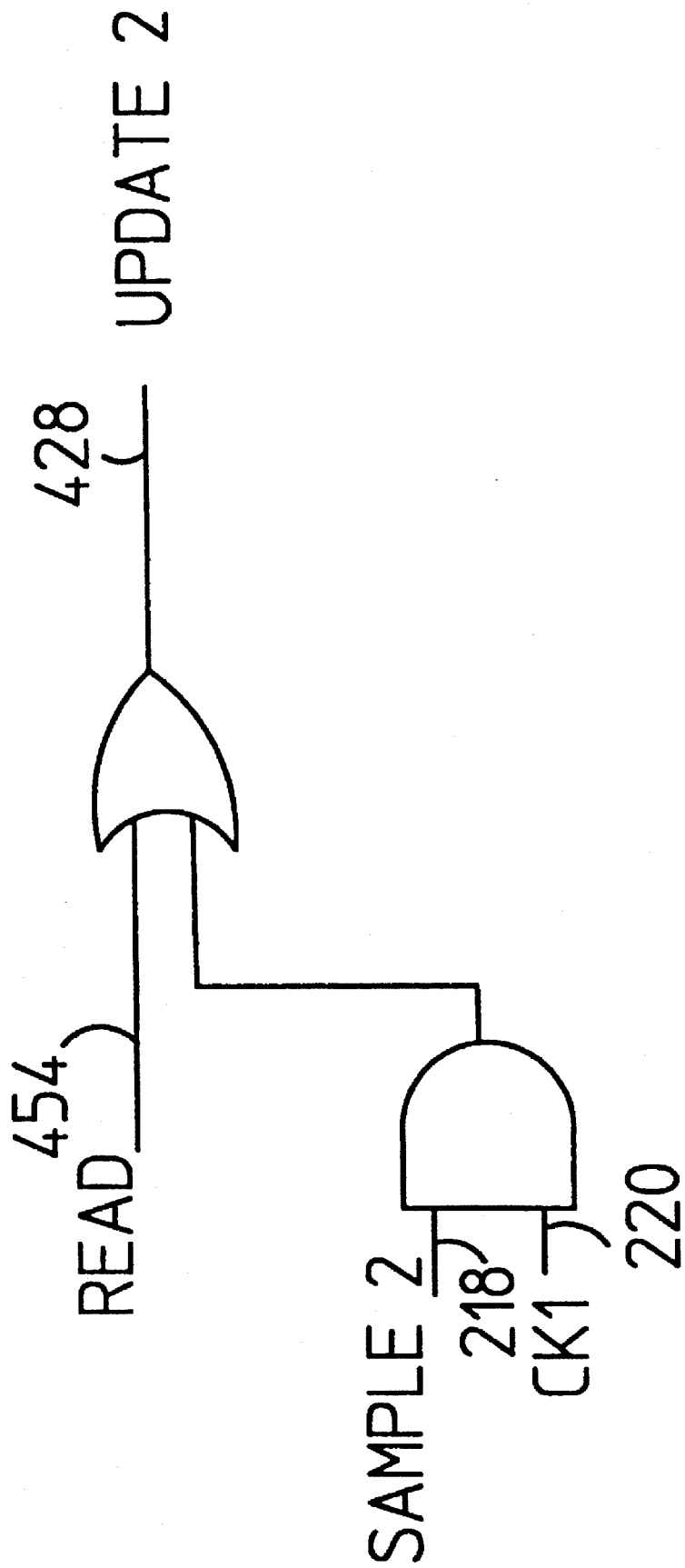
FIG. 4B is a schematic of control signals used in conjunction with alternative embodiments of the register cell illustrated in FIG. 4A.

In integrated circuits having sequential stages of logic, for example in pipelining or multiplication circuitry, it is common to have multiple stages in which alternate stages are clocked by complementary clocks. For example, even numbered stages might be clocked by a first clock signal and odd numbered stages might be clocked by a second clock signal which is a logical complement of the first clock signal. Note that in FIG. 4A, transparent latch 410 is latched on the falling edge of CK1N (246). An adjacent circuit (not illustrated) in a complementary stage receiving the output signal 404 as an input might latch on the falling edge of CK2N (226). For simplicity, much of the following discussion will refer to control signals and clock signals as used in FIG. 4A but note that complementary stages are also used. In particular, FIG. 4B illustrates the logical relationship of the UPDATE2 (428) control signal and the SAMPLE2 (218) control signal as used in complementary stages that latch on the falling edge of CK2N (226). The two UPDATE signals are generated locally within major blocks and distributed to multiple latches.

Figure 5:
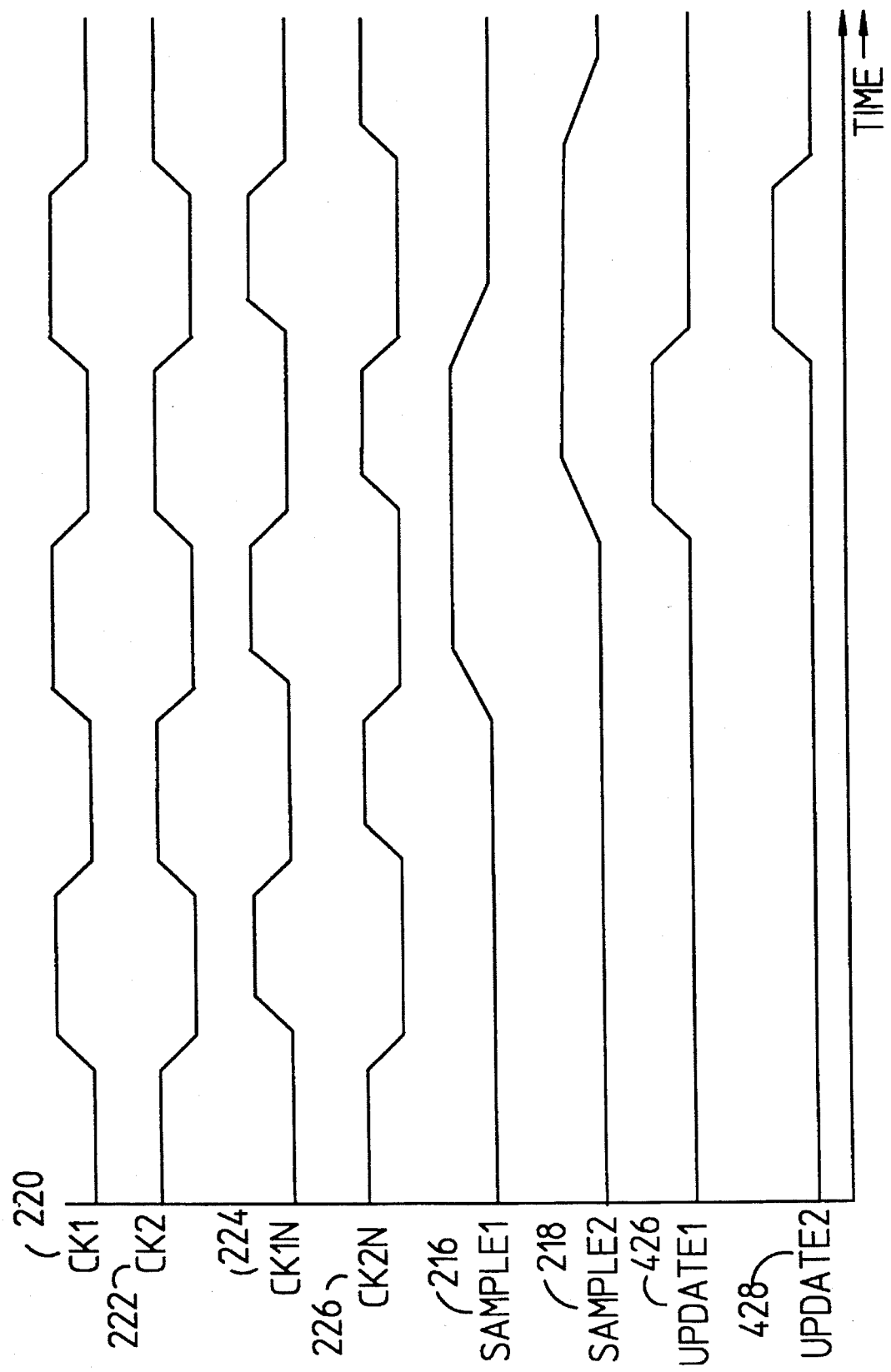
FIG. 5 is a timing diagram of signals referenced in FIGS. 2, 3, 4A, and 4B.

In FIG. 4A, when the UPDATE1 signal 426 is logically false and the SHIFT clock 450 is logically false, latches 420 and 422 are idle, thereby conserving power. An internal state of the integrated circuit 200 is captured by latch 420 when UPDATE1 (426) is logically true (triggered internally or externally). During static testing with the system clocks paused, the READ signal 454 is used to generate UPDATE1 (426). For testing during normal operation of the integrated circuit 200 at the operating frequency, however, the timing of the rising and falling edges of the UPDATE1 signal (426) is critical. FIG. 5 illustrates timing diagrams of the critical control signals and clocks. The timing illustrated in FIG. 5 ensures that stable internal states are captured at precise times during normal operation of the integrated circuit 200.

FIG. 5 is a timing diagram illustrating the four clock signals (220, 222, 224, 226), the two SAMPLE signals (216, 218) and the two UPDATE signals (426, 428). The two clock signals CK1 (220) and CK2 (222) are routed by extremely low-capacitance lines and driven by large high-current drivers. In contrast, the SAMPLE1 signal (216) is routed throughout the chip over ordinary signal lines and is driven by smaller drivers. Therefore, as illustrated in FIG. 5, the SAMPLE1 signal (216) has significant rise time and delay relative to the rising edge of CK1 (220). Referring now to both FIG. 4A and FIG. 5, latch 410 is transparent while CK1N (224) is high and latches on the falling edge of CK1N (224). After SAMPLE1 (216) goes high, UPDATE1 (426) goes high on the next rising edge of CK2 (222). Therefore, at the time UPDATE1 (426) goes high, the output of latch 410 is stable and SAMPLE1 (216) has had sufficient time to rise to a stable high level. In addition, by gating SAMPLE1 (216) with CK2 (222), the D-input of latch 420 is guaranteed to be open (UPDATE1 (426) low) before the D-input of latch 410 is driven again at the rising edge of CK1N (224). Therefore, latch 420 is guaranteed to latch a stable output from latch 410 while the integrated circuit is operating at normal operating frequency. Capturing the state of latch 410 by latch 420 does not destroy the state of latch 410 (sampling is non-destructive). Once SAMPLE1 (216) goes low, the state captured in latch 420 (and the thousands of states captured simultaneously in other scan cells) can be sequentially shifted out of the Test Access Port (FIG. 2, 108) for verification. Once SAMPLE1 (216) goes low, the SHIFT clock (FIG. 2, 450, 452) can be driven at any rate and completely independent of the system clocks (220, 222, 224, 226). Therefore, the integrated circuit 200 can continue to operate while captured states are being shifted out. Finally, the internal state sampling at operating speed can be triggered either internally or externally.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A test circuit for a digital logic system, the digital logic system having a plurality of I/O pins and a plurality of logic nodes, each logic node having a logic state, the test circuit comprising:

a test data output port;

a boundary scan shift register interposed between the plurality of I/O pins and the test data output port; and an internal test-data shift register interposed between the plurality of logic nodes and the test data output port, the internal test-data shift register captures internal logic states while the digital logic system operates at a normal operating frequency.

2. The test circuit as in claim 1, wherein the boundary scan shift register comprises a first plurality of sample latches, each sample latch having a latch input coupled to one of the plurality of I/O pins, the first plurality of sample latches serially connected to form the boundary scan register.

3. The test circuit as in claim 2, wherein the internal test-data shift register comprises a second plurality of sample latches, each sample latch having a latch input coupled to one of the plurality of logic nodes, the second plurality of sample latches serially connected to form the internal test-data shift register.

4. The test circuit as in claim 3, further comprising:

an update signal connected to each of the second plurality of sample latches, wherein each sample latch latches the logic state at its input at an operating frequency when the update signal is asserted; and a shift clock connected to each of the second plurality of sample latches, wherein the internal test-data shift register serially shifts one of the latched logic states out the test data output port during each cycle of the shift clock.

* * * * *